United States Patent
Kim

(10) Patent No.: US 9,774,000 B2
(45) Date of Patent: Sep. 26, 2017

(54) ORGANIC LIGHT-EMITTING DISPLAY DEVICE WITH MULTI-LAYERED ENCAPSULATION

(71) Applicant: Samsung Display Co., Ltd., Yongin, Gyeonggi-do (KR)

(72) Inventor: Seol Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/077,170

(22) Filed: Nov. 11, 2013

(65) Prior Publication Data

US 2014/0361263 A1    Dec. 11, 2014

(30) Foreign Application Priority Data

Jun. 7, 2013    (KR) .................. 10-2013-0065469

(51) Int. Cl.

| | | |
|---|---|---|
| *H01L 51/05* | (2006.01) | |
| *B82Y 10/00* | (2011.01) | |
| *H01L 51/00* | (2006.01) | |
| *H01L 51/50* | (2006.01) | |
| *H01L 27/12* | (2006.01) | |
| *H01L 51/56* | (2006.01) | |
| *B82Y 30/00* | (2011.01) | |
| *H01L 51/52* | (2006.01) | |
| *H01L 27/32* | (2006.01) | |

(52) U.S. Cl.
CPC ...... *H01L 51/5253* (2013.01); *H01L 27/3211* (2013.01); *H01L 27/3244* (2013.01); *H01L 51/5256* (2013.01)

(58) Field of Classification Search
CPC ............ H01L 51/0545; H01L 51/0036; H01L 51/0541; H01L 51/5012; H01L 27/1214; H01L 51/56; B82Y 10/00; B82Y 30/00; Y02E 10/50
USPC ....................... 257/40; 438/82, 99
See application file for complete search history.

(56) References Cited

U.S. PATENT DOCUMENTS

| | | | |
|---|---|---|---|
| 8,419,494 B2 | 4/2013 | Kwack et al. | |
| 2005/0285521 A1* | 12/2005 | Menda ........................ | 313/512 |
| 2008/0211394 A1* | 9/2008 | Koshihara et al. .......... | 313/504 |
| 2009/0200544 A1* | 8/2009 | Lee et al. ...................... | 257/40 |
| 2010/0238096 A1* | 9/2010 | Jeon et al. .................... | 345/83 |
| 2011/0140163 A1 | 6/2011 | Oh et al. | |

(Continued)

FOREIGN PATENT DOCUMENTS

| | | |
|---|---|---|
| KR | 10-2011-0065854 A | 6/2011 |
| KR | 10-2012-0043571 A | 5/2012 |
| KR | 10-2012-0065049 A | 6/2012 |

*Primary Examiner* — Allen Parker
*Assistant Examiner* — Didarul Mazumder
(74) *Attorney, Agent, or Firm* — Lewis Roca Rothgerber Christie LLP

(57) ABSTRACT

An organic light-emitting display device is provided. The organic light-emitting display device includes: a substrate; a display unit on the substrate and includes a plurality of driving thin film transistors (TFTs) and a plurality of organic light-emitting diodes (OLEDs); and a sealing layer to cover the display unit which includes a first sealing layer that is formed of at least one inorganic layers to cover the plurality of OLEDs and a second sealing layer that is formed of at least one inorganic layers and at least one organic layers to enclose the plurality of OLEDs.

20 Claims, 5 Drawing Sheets

(56) References Cited

U.S. PATENT DOCUMENTS

| | | | |
|---|---|---|---|
| 2011/0140164 A1* | 6/2011 | Seo | H01L 51/5256 257/100 |
| 2011/0163330 A1* | 7/2011 | Kim | H01L 51/5256 257/88 |
| 2012/0098026 A1* | 4/2012 | Kwack | H01L 51/5253 257/100 |
| 2012/0146062 A1* | 6/2012 | Oda | H01L 27/3211 257/88 |
| 2012/0146492 A1* | 6/2012 | Ryu et al. | 313/512 |
| 2013/0092972 A1* | 4/2013 | Kim | H01L 51/5256 257/100 |
| 2014/0028181 A1* | 1/2014 | Lee et al. | 313/504 |
| 2014/0062292 A1* | 3/2014 | Seong | H01L 51/5253 313/504 |

* cited by examiner

ORGANIC LIGHT-EMITTING DISPLAY DEVICE WITH MULTI-LAYERED ENCAPSULATION

CROSS-REFERENCE TO RELATED APPLICATION

This application claims priority to and the benefit of Korean Patent Application No. 10-2013-0065469, filed on Jun. 7, 2013, in the Korean Intellectual Property Office, the disclosure of which is incorporated herein in its entirety by reference.

BACKGROUND

1. Field

The following description relates to an organic light-emitting display device, and more particularly, to an organic light-emitting display device that prevents or reduces a progressive dark defect.

2. Description of the Related Art

An organic light-emitting display device has desired characteristics (such as viewing angle, contrast, response speed, power consumption, etc.), and thus has a wide range of applications from a personal portable device (such as an MP3 player, a portable phone, or the like) to a TV.

The organic light-emitting display device also has a self-luminescence characteristic and thus does not need to utilize an additional fight source. Therefore, the thickness and the weight of the organic light-emitting display device can be reduced.

However, the organic light-emitting display device can become deteriorated by permeation of water or oxygen, and it is difficult to prevent water and oxygen from permeating the organic light-emitting display device.

SUMMARY

Aspects of the embodiments of the present invention provide an organic light-emitting display device that prevents or blocks a path of a progressive dark defect.

According to an embodiment of the present invention, an organic light-emitting display device includes a substrate, a display unit on the substrate, the display unit including a plurality of driving thin film transistors (TFTs) and a plurality of organic light-emitting diodes (OLEDs), and a sealing layer covering the display unit, the sealing layer including, a first sealing layer having at least one inorganic layer, and covering each of the plurality of OLEDs, and a second sealing layer having at least one inorganic layer and at least one organic layer enclosing the plurality of OLEDs, wherein the at least one inorganic layer and the at least one organic layer are layered alternately.

The plurality of OLEDs may include a first electrode, a second electrode, and an organic layer between the first electrode and the second electrode.

The at least one inorganic layer of the first or the second sealing layer may be formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide.

The at least one organic layer may be formed of an acryl resin, a methacryl resin, an isoprene resin, a vinyl resin, an epoxy resin, an urethane resin, a cellulose resin, a perylene resin, an imide resin, or a compound of two or more thereof.

The second sealing layer may extend on the substrate to cover at least a portion of non-display area (NDA) around the display unit.

The first sealing layer may be on the each of the plurality of OLEDs, and wherein the first sealing layer and the second sealing layer contact each other to enclose the plurality of OLEDs by the second sealing layer.

The substrate may be a flexible substrate.

Each of the plurality of driving TFTs may include an active layer on the substrate, a gate insulating layer on the active layer, a gate electrode on the gate insulating layer to insulate the gate electrode from the active layer, an interlayer dielectric layer on the gate electrode, source and drain electrodes coupled with the active layer through openings in the interlayer dielectric layer and the gate insulating layer, and a planarization layer on the substrate to cover the source and drain electrodes.

The at least one inorganic layer of the first sealing layer and the at least one inorganic layer of the second sealing layer may cover the display unit, and wherein the at least one organic layer of the first sealing layer may only be on each of the plurality of OLEDs.

According to another embodiment of the present invention, an organic light-emitting display device includes a substrate, a display unit on the substrate, the display unit including, a plurality of driving thin film transistors (TFTs), and a plurality of pixel groups, each pixel group of the plurality of pixel groups including a plurality of pixels, and a sealing layer covering the display unit, the sealing layer including, a first sealing layer having at least one inorganic layer, and covering each organic light-emitting diode (OLED) of a plurality of OLEDs in each pixel group, and a second sealing layer having at least one inorganic layer and at least one organic layer at edges of each of the pixel groups, wherein the at least one inorganic layer and the at least one organic layer are layered alternately.

Each of the plurality of pixels may be a red (R) pixel, a green (G) pixel, or a blue (B) pixel.

The second sealing layer may be between the plurality of pixel groups.

Each of the plurality of pixel groups may include a same number of pixels or a different number of pixels.

The at least one organic layer of the first sealing layer may cover the plurality of OLEDs, and wherein the at least one inorganic layer of the first sealing layer and the at least one inorganic layer of the second sealing layer may be on the plurality of pixel groups.

The display unit may be a top emission display unit or a bottom emission display unit.

BRIEF DESCRIPTION OF THE DRAWINGS

The above and other features and aspects of the embodiments of the present invention will become more apparent by describing in more detail example embodiments thereof with reference to the drawings in which.

DETAILED DESCRIPTION

Figure 1:
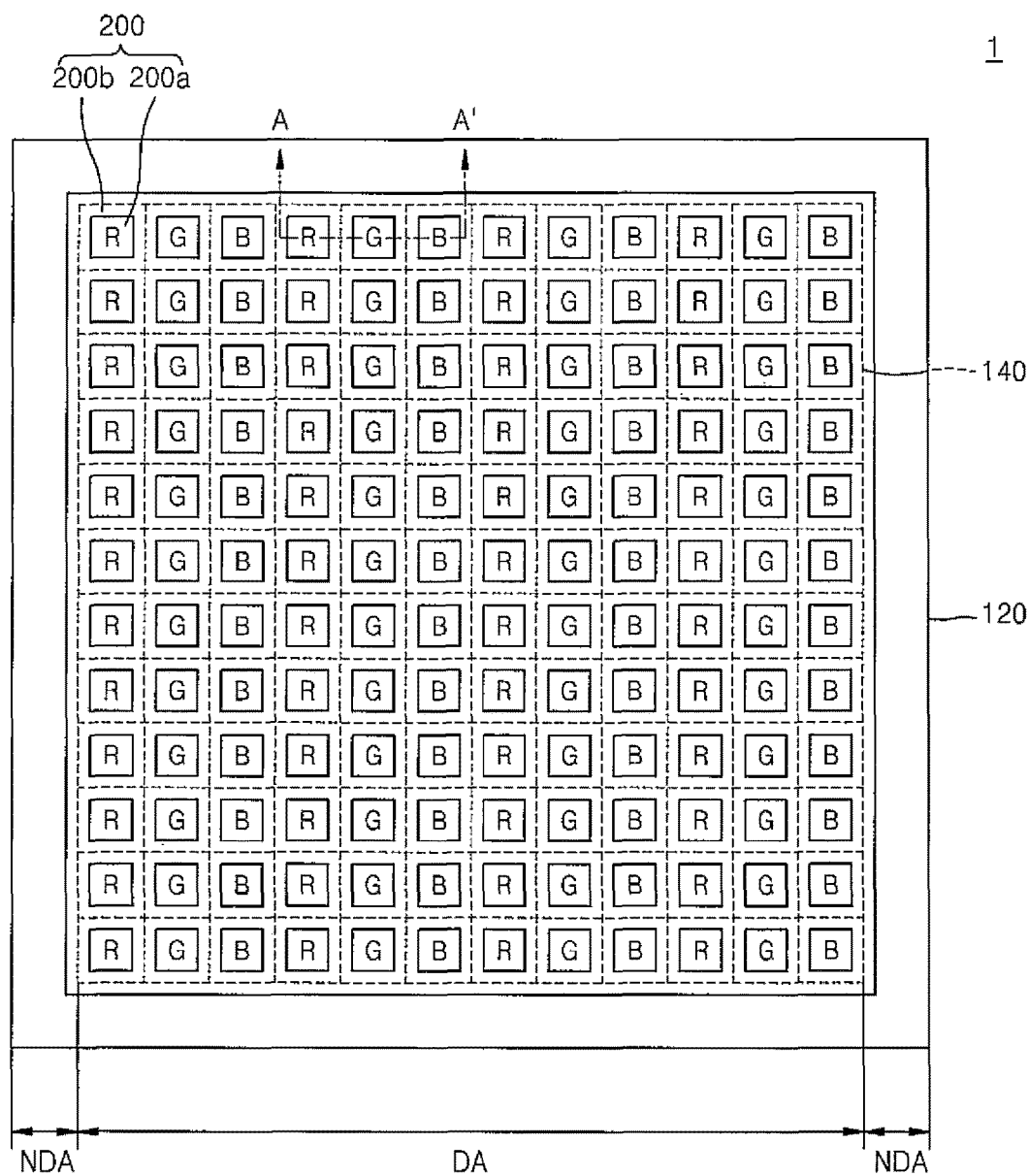
FIG. 1 is a schematic plan view illustrating an organic light-emitting display device according to an example embodiment of the present invention.

The drawings illustrate example embodiments of the present invention, and are referred to in order to gain a sufficient understanding of the embodiments of the present invention, the merits thereof, and the objectives accomplished by the implementation of the embodiments of the present invention.

It will be understood that, although the terms first, second, third etc., are used herein to describe various elements, these elements are not limited by these terms. These terms are used to distinguish one element from another. Thus, a first element discussed below could be termed a second element without departing from the teachings of the present disclosure.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on" etc.).

The terminology used herein is for the purpose of describing particular example embodiments and is not intended to limit the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by a person having ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in more detail by explaining example embodiments of the invention with reference to the drawings. Like reference numerals in the drawings denote like elements. Expressions such as "at least one of," when preceding a list of elements, modify the entire list of elements and do not modify the individual elements of the list. Further, the use of "may" when describing embodiments of the present invention refers to "one or more embodiments of the present invention."

Figure 2:
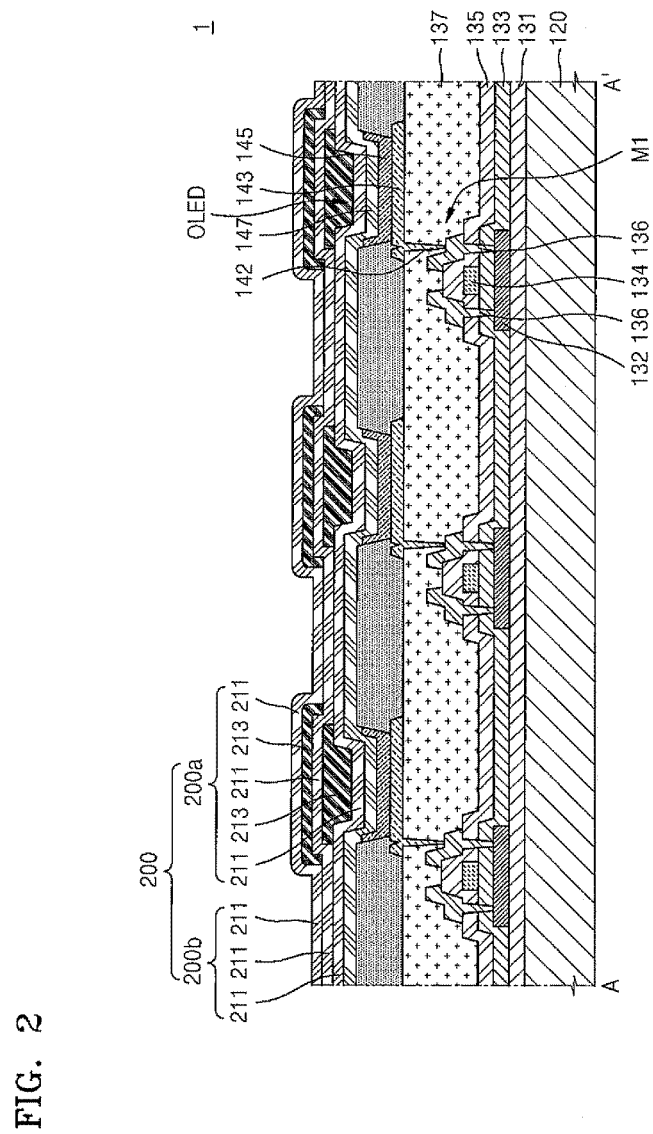
FIG. 2 is a schematic cross-sectional view taken along line A-A' of FIG. 1.

FIG. 1 is a schematic plan view illustrating an organic light-emitting display device 1 according to an example embodiment of the present invention. FIG. 2 is a schematic cross-sectional view taken along line A-A' of FIG. 1.

Referring to FIGS. 1 and 2, the organic light-emitting display device 1 includes a substrate 120 and a sealing layer 200 that covers a display unit 140 formed on the substrate 120.

The substrate 120 may be, for example, a transparent glass substrate having SiO2 as a main (or major) component, a plastic substrate, a metal substrate, or a substrate formed of various suitable materials. The substrate 120 may be formed of a plastic material having high heat-resisting characteristic and durability such as, for example, polyethylene ether phthalate, polyethylene naphthalate, polycarbonate, polyarylate, polyetherimide, polyethersulfone, polyimide, or the like. However, the embodiments of the present invention are not limited thereto, and thus the substrate 120 may be formed of various types of flexible material.

As shown in FIG. 2, the display unit 140 formed on the substrate 120 includes a driving thin film transistor (TFT) M1 and an organic light-emitting diode (OLED). FIG. 2 is illustrated with a top emission display unit 140 by way of example, but the embodiments of the present invention are not limited thereto. Therefore, the display unit 140 may also, or instead, be a bottom emission display unit 140 or have various structures different from the structure of FIG. 2.

In some embodiments, an insulating layer 131, such as a barrier layer and/or a buffer layer, is formed on an upper surface of the substrate 120 to prevent impurity ions from diffusing, prevent water or air from permeating, and to planarize a surface.

In some embodiments, the driving TFT M1 is formed as a driving circuit on the insulating layer 131. In the present example embodiment, a top gate TFT is described by way of example of the TFT. However, different types of TFTs such as a bottom gate TFT, etc., may be included.

In some embodiments, an active layer 132 of the driving TFT M1 is formed of a semiconductor material on the insulating layer 131, and a gate insulating layer 133 is formed to cover the active layer 132.

The active layer 132 may be formed of, for example, polysilicon. In this case, a set area may be doped with dopant. The active layer 132 may also be formed of, for example, amorphous silicon (i.e., not polysilicon) or various types of organic semiconductor materials such as pentacene, etc.

If the active layer 132 is to be formed of polysilicon, then an amorphous silicon may be formed and crystallized to be transformed into polysilicon. Various suitable methods, such as, for example, a rapid thermal annealing (RTA) process, a solid phase crystallization (SPC) method, an excimer laser annealing (ELA) method, a metal induced crystallization (MIC) method, a metal induced lateral crystallization (MILC) method, a sequential lateral solidification (SLS) method, etc., may be used for the crystallization method. However, if a plastic substrate is utilized, then a method that does not rely on a high-temperature annealing process may be selected and utilized.

In some embodiments, the gate insulating layer 133 may be formed of an insulating material such as, for example, silicon oxide, silicon nitride, an insulating organic material, or the like.

In some embodiments, a gate electrode 134 is formed on the gate insulating layer 133, and an interlayer dielectric layer 135 is formed to cover the gate electrode 134.

The gate electrode 134 may be formed of various types of conductive materials. For example, the gate electrode 134 may be formed of a material such as Mg, Al, Ni, Cr, Mo, W, MoW, Au, or the like. Even when the gate electrode 134 is formed of these materials, the gate electrode 134 may be formed as a single layer form or a multilayer form. That is, the gate electrode 134 may be modified into various forms.

The interlayer dielectric layer 135 may be formed of an insulating material such as, for example, silicon oxide, silicon nitride, an insulating organic material, or the like.

In some embodiments, the interlayer dielectric layer 135 and the gate insulating layer 133 are selectively removed, and a gate electrode material is formed as a single or multilayer form on the interlayer dielectric layer 135 to form a source or drain electrode 136.

In some embodiments, a planarization layer 137 is formed on the interlayer dielectric layer 135 to cover the source or drain electrode 136 to protect and planarize the driving TFT M1. The planarization layer 137 may be formed in various forms and may be formed of an organic material, such as, for example benzocyclobutene (BCB) or acryl, or an inorganic material such as SiNx. The planarization layer 137 may be formed as a single layer, a dual layer, or a multiple layer. That is, the planarization layer 137 may be modified into various forms.

In some embodiments, a first electrode 143 of the OLED is formed on the planarization layer 137 and is electrically connected to the drain electrode 136 through a contact hole 142.

In some embodiments, a second electrode 147 is formed on the first electrode 143, to face the first electrode 143.

In some embodiments, the first electrode 143 operates as an anode, and the second electrode 147 operates as a cathode. However, polarities of the first and second electrodes 143 and 147 may be opposite (vice versa).

The first electrode 143 may be a transparent electrode or a reflective electrode. If the first electrode 143 is a transparent electrode, the first electrode 143 may be formed of, for example, ITO, IZO, ZnO, or In2O3. If the first electrode 143 is a reflective electrode, the first electrode 143 may include a reflective layer formed of, for example, Ag, Mg, Al, Pt, Pd, Au, Ni, Nd, Ir, Cr, or a compound thereof, and a transparent layer formed of, for example, ITO, IZO, ZnO, or In2O3.

The second electrode 147 may be a transparent electrode or a reflective electrode. If the second electrode 147 is a transparent electrode, the second electrode 147 may include a layer that is formed by depositing, for example, Li, Ca, LiF/Al, Al, Mg, or a compound thereof toward an intermediate layer and an auxiliary electrode, or a bus electrode line that is formed of a transparent conductive material such as, for example, ITO, IZO, ZnO, or In2O3 on the layer. If the second electrode 147 is a reflective electrode, the second electrode 147 may be formed of, for example, Li, Ca, LiF/Ca, LiF/Al, Al, Mg, or a compound thereof.

In some embodiments, the first electrode 143 patterned in each sub pixel is electrically connected to a TFT M1 of each sub pixel. Here, the second electrode 147 may be formed as a common electrode that is connected to all sub pixels. If the substrate 120 does not include a TFT in each sub pixel, the first and second electrodes 143 and 147 are patterned in stripe patterns intersecting with (or crossing) one another to be driven as a passive matrix display.

In some embodiments, an organic layer 145 is interposed between the first and second electrodes 143 and 147.

The organic layer 145 may be formed of a low or high polymer organic material. If the organic layer 145 is formed of a low polymer organic material, a hole injection layer (HIL), a hole transport layer (HTL), an emission layer (EML), an electron transport layer (ETL), an electron injection layer (EIL), etc. may be stacked as a single or complex structure. Various materials, such as, for example, copper phthalocyanine (CuPc), (N,N'-Di(naphthalene-1-yl)-N,N'-diphenyl-benzidine: NPB), (tris-8-hydroxyquinoline aluminum) (Alq3), etc., may be applied as the organic material. The low polymer organic materials may be formed by using a vapor deposition method and masks. If the organic layer 145 is formed of a high polymer organic material, the organic layer 145 may have a structure that includes an HTL and an EML. Here, the HTL may be formed of PEDOT, and the EML may be formed of Poly-Phenylenevinylene (PPV) and polyfluorene.

The sealing layer 200 is formed to cover the display unit 140 that is a display area (DA) and includes first and second sealing layers 200a and 200b. Because the OLED is easily deteriorated by external factors such as water or oxygen, the sealing layer 200 prevents external oxygen or water from permeating into the display unit 140.

In some embodiments, the first sealing layer 200a is on the OLED to cover the OLED, and the second sealing layer 200b encloses the OLED. The second sealing layer 200b may be formed to cover a portion of a non-display area (NDA) around the display unit 140. For example, the second sealing layer 200b formed on the substrate 120 may extend from a periphery of the OLED to the NDA.

At least one or more inorganic layers 211 and organic layers 213 may be layered alternately with each other to form the first sealing layer 200a. The second sealing layer 200b may be formed of at least one or more inorganic layers 211. That is, the first sealing layer 200a includes an inorganic layer 211 and an organic layer 213, and the second sealing layer 200b includes only inorganic layers 211.

In FIG. 2, three inorganic layers 211 and two organic layers 213 are alternately formed to form the first sealing layer 200a, and three inorganic layers 211 are formed to form the second sealing layer 200b. However, the present invention is not limited thereto, and thus the first and second sealing layers 200a and 200b may be suitably formed according to desired layer thicknesses.

The inorganic layer 211 may be formed of, for example, silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide. The inorganic layer 211 may be formed to a suitable thickness according to productivity or a device characteristic. The inorganic layer 211 is thin and dense and thus behaves as a barrier to water and oxygen.

The organic layer 213 may be formed of, for example, an acryl resin, a methacryl resin, an isoprene resin, a vinyl resin, an epoxy resin, an urethane resin, a cellulose resin, a perylene resin, an imide resin, or a compound of two or more thereof. The organic layer 213 may be formed to a suitable thickness according to a characteristic of the inorganic layer 211, productivity, and a device characteristic. The organic layer 213 relieves stress of the inorganic layer 211 and planarizes the inorganic layer 211.

The sealing layer 200 may be formed by using a method such as, for example, sputter, thermal evaporator, chemical vapor deposition (CVD), plasma enhanced chemical vapor deposition (PECVD), ion beam assisted deposition (IBAD), atomic layer deposition (ALD), or the like.

If external water or oxygen permeates into the display unit 140, and thus a dark defect occurs, a size of the dark defect may increase as time passes. In particular, if the organic layer 213 acts as a path for the dark defect, and thus the dark defect extends from a progressive dark defect to a defect area, the second sealing layer 200a formed of at least one or more inorganic layers provided around the OLED prevents the extension of the dark defect.

In other words, although a dark defect occurs in one OLED, an extension (or expansion) of the dark defect is prevented by the second sealing layer 200b formed of only the inorganic layer around the OLED. Therefore, reliability of the organic light-emitting display device 1 may be improved.

Also, the embodiments of the present invention are not limited to the arrangements and shapes of R, G, and B pixels of FIG. 1, and thus the R, G, and B pixels may have different arrangements and shapes.

Figure 3:
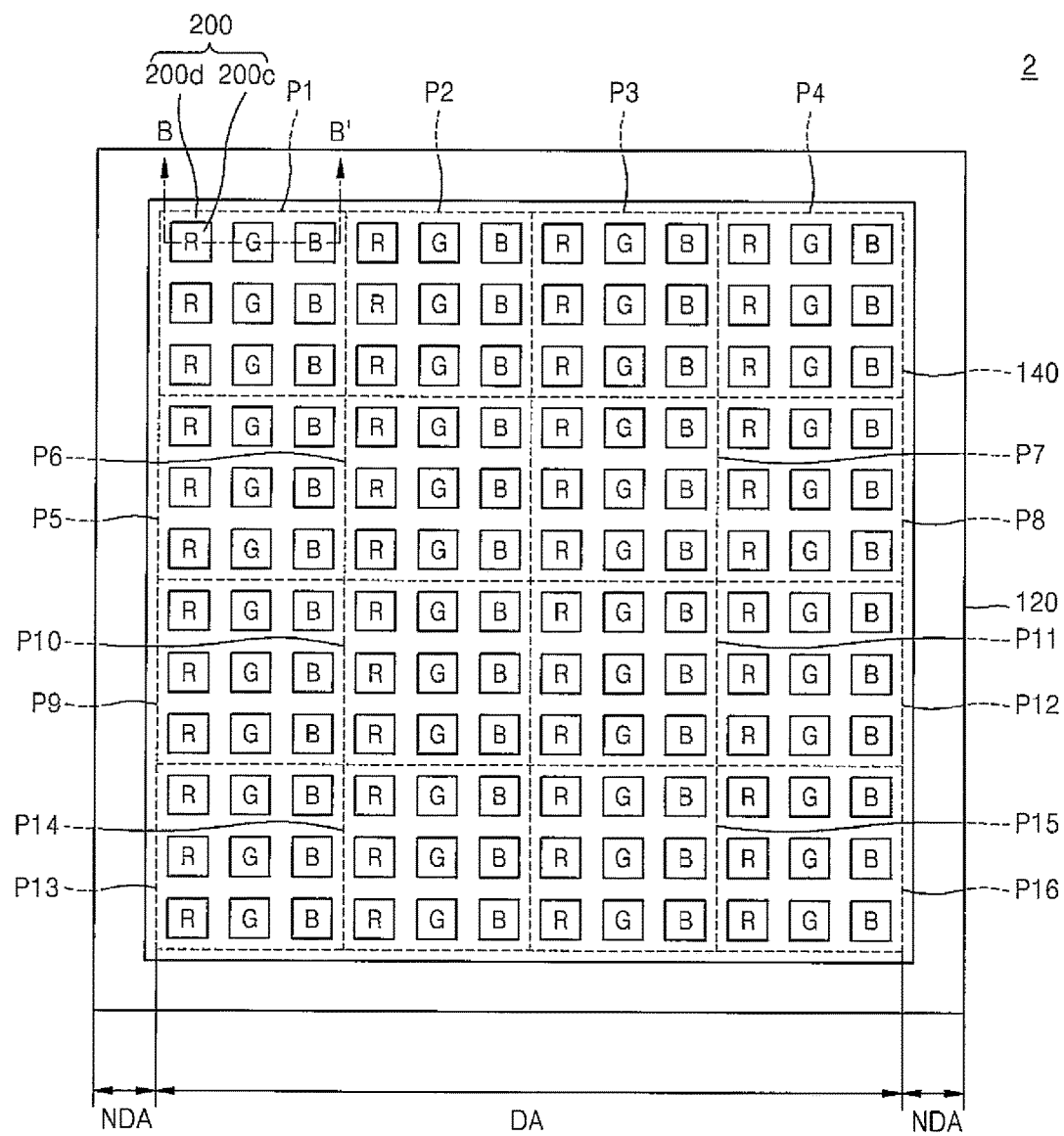
FIG. 3 is a schematic plan view illustrating an organic light-emitting display device according to another example embodiment of the present invention.
Figure 4:
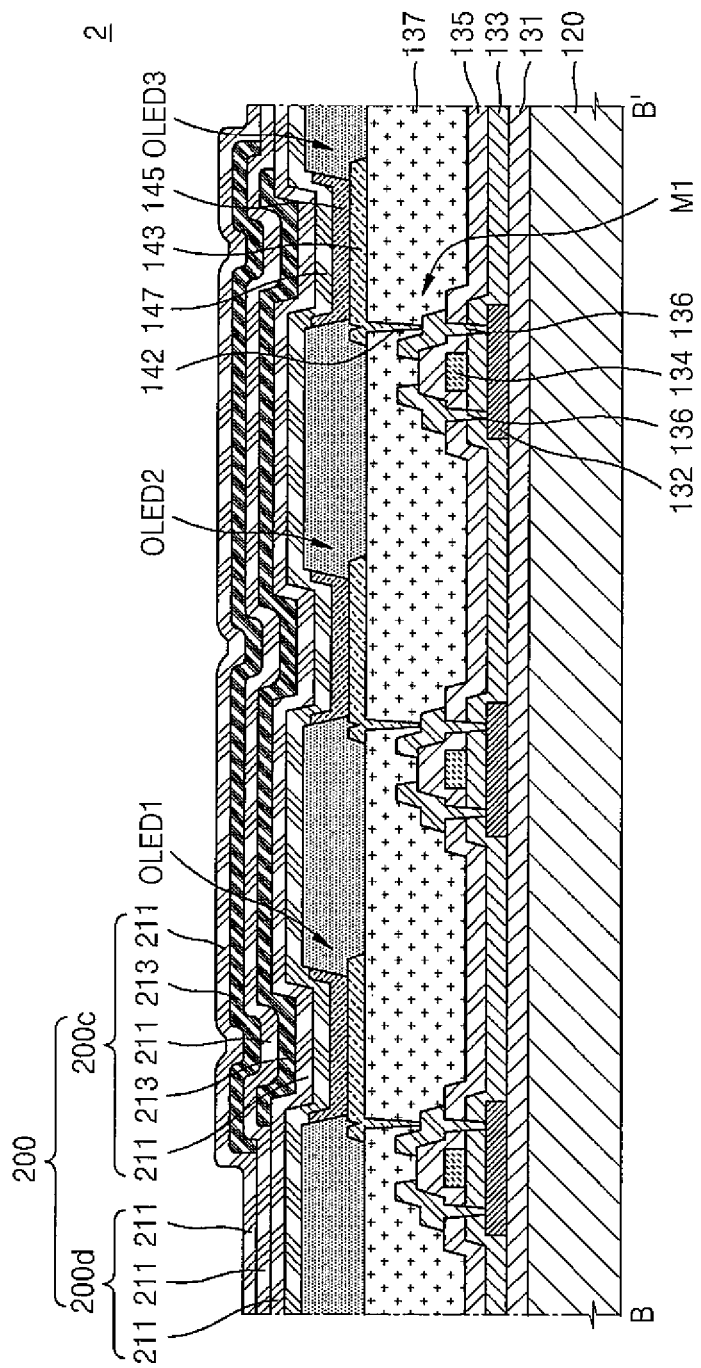
FIG. 4 is a schematic cross-sectional view taken along line B-B' of FIG. 3.

FIG. 3 is a schematic plan view illustrating an organic light-emitting display device 2 according to another example embodiment of the present invention. FIG. 4 is a schematic cross-sectional view taken along line B-B' of FIG. 3. The same elements of FIGS. 3 and 4 as those of the organic light-emitting display device 1 of FIGS. 1 and 2 are denoted by the same reference numerals, and thus their repeated descriptions are not provided again.

Referring to FIGS. 3 and 4, the organic light-emitting display device 2 according to the present example embodiment includes a substrate 120, and a sealing layer 200 that covers a display unit 140 formed on the substrate 120.

As shown in FIG. 3, the display unit 140 includes a driving TFT M1 and a plurality of pixel groups P1, P2, ..., and P16. Each of the plurality of pixel groups P1, P2, ..., and P16 includes a plurality of red (R) pixels, a plurality of green (G) pixels, and a plurality of blue (B) pixels.

The sealing layer 200 is formed to cover a whole portion of the display unit 140 and includes first and second sealing layers 200c and 200d.

The first sealing layer 200c is on a plurality of OLEDs to cover the plurality of OLEDs included in the pixel groups P1, P2, ..., and P16. The second sealing layer 200d encloses the edges of the pixel groups P1, P2, ..., and P16.

In the plurality of pixel groups P1, P2, P3, P4, P5, P8, P9, P12, P13, P14, P15, and P16, the second sealing layer 200d may be formed to cover a portion of a NDA around the display unit 140. For example, the second sealing layer 200d may extend from the edge of the first pixel group P1 to the NDA formed on the substrate 120.

In more detail, referring to FIG. 4 illustrating a schematic cross-section of the first pixel group P1, the first sealing layer 200c is on first, second, and third OLEDs OLED1, OLED2, and OLED3 to cover the first, second, and third OLEDs OLED1, OLED2, and OLED3. The second sealing layer 200d is provided around the first and third OLEDs OLED1 and OLED3.

At least one or more inorganic layers 211 may be layered alternately with at least one or more organic layers 213 to form the first sealing layer 200c. The second sealing layer 200d may be formed of at least one or more inorganic layers 211. That is, the first sealing layer 200c includes inorganic layers 211 and organic layers 213, and the second sealing layer 200d includes only inorganic layers 211.

In FIG. 4, each of the three inorganic layers 211 alternate with each of the two organic layers 213 to form the first sealing layer 200c, and the second sealing layer 200d is formed of three inorganic layers 211. However, the present invention is not limited thereto, and the first and second sealing layers 200c and 200d may be suitably formed to desired thicknesses.

The organic layer 211 may be formed of, for example, silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide. The inorganic layer 211 may be formed to a suitable thickness according to productivity or a device characteristic. The inorganic layer 211 is thin and dense and thus behaves as a barrier with respect to water and oxygen.

The organic layer 213 may be formed of, for example, an acryl resin, a methacryl resin, an isoprene resin, a vinyl resin, an epoxy resin, an urethane resin, a cellulose resin, a perylene resin, an imide resin, or a compound of two or more thereof. The organic layer 213 may be formed to a suitable thickness according to a characteristic of the inorganic layer 211, productivity, and a device characteristic. The organic layer 213 relieves stress of the inorganic layer 211 and planarizes the inorganic layer 211.

The sealing layer 200 may be formed by using a method such as, for example, sputter, a thermal evaporator, CVD, PECVD, IBAD, ALD, or the like.

If external water or oxygen permeates into the first pixel group P1, a dark defect occurs. Therefore, the second sealing layer 200d is formed of at least one or more inorganic layers at the edge of the first pixel group P1 and the edges of a plurality of pixel groups P2, P5, and P6 adjacent to the first pixel group P1. Therefore, the dark defect occurring in the first pixel group P1 may be prevented from moving to the pixel groups P2, P5, and P6. Therefore, the defect area is prevented from extending (or expanding) due to a progressive dark defect. Thus reliability of the organic light-emitting display device 2 may be improved.

In the above-described example embodiment, 9 pixels (e.g., three of each of R, G, and B pixels) constitute each of the pixel groups P1, P2, ..., and P16, and the second sealing layer 200d is formed at edges of the pixel groups P1, P2, ..., and P16. However, the embodiments of the present invention is not limited thereto, and the pixel groups P1, P2, ..., and P16 may have different shapes and different pixel numbers.

Figure 5:
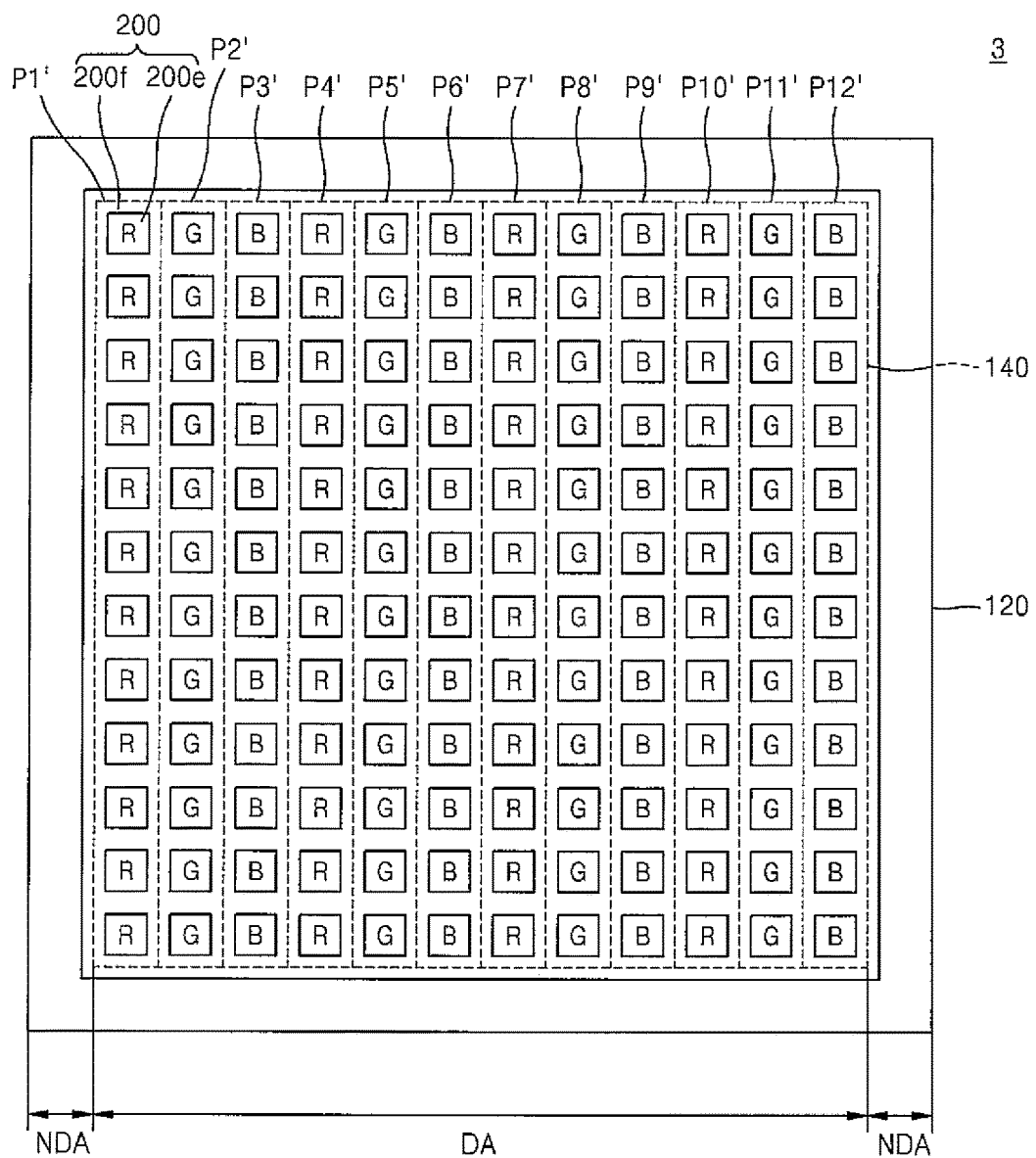
FIG. 5 is a schematic plan view illustrating an organic light-emitting display device according to another example embodiment of the present invention.

FIG. 5 is a schematic plan view illustrating an organic light-emitting display device 3 according to another example embodiment of the present invention. The same elements of the organic light-emitting display device 3 of FIG. 5 as those of the organic light-emitting display device 1 of FIG. 1 are denoted by the same reference numerals, and thus their repeated descriptions are omitted.

Referring to FIG. 5, the organic light-emitting display device 3 includes a substrate 120 and a sealing layer 200 that covers a display unit 140 formed on the substrate 120.

The display unit 140 includes a plurality of pixel groups P1', P2', ..., and P12', and each of the plurality of pixel groups P1', P2', ..., and P12' includes a plurality or R pixels, a plurality of G pixels, and a plurality of B pixels.

The sealing layer 200 is formed to cover the whole portion of the display unit 140 and includes first and second sealing layers 200e and 200f.

The first sealing layer 200e is on a plurality of OLEDs included in each of the plurality of pixel groups P1', P2', ..., and P12' to cover the OLEDs, and the second sealing layer 200f encloses edges of each of the pixel groups P1', P2', ..., and P12'.

In the plurality of pixel groups P1', P2', ..., and P12' formed at the edge of the display unit 140, the second sealing layer 200f may be formed to cover a portion of the NDA around the display unit 140. For example, the second sealing layer 200f may extend from the edge of the first pixel group P1' to the NDA, and formed on the substrate 120.

At least one or more inorganic layers may be layered alternately with at least one or more organic layers to form the first sealing layer 200e. The second sealing layer 200f may be formed of at least one or more inorganic layers. In other words, the first sealing layer 200e is formed of inorganic layers and organic layers, and the second sealing layer 200f is formed of only inorganic layers.

If external water or oxygen permeates the second pixel group P2', a dark defect occurs. Therefore, the second sealing layer 200f is formed of only at least one or more inorganic layers at the edge of the second pixel group P2' and the edges of the first and third pixel groups P1' and P3' adjacent to the second pixel group P2'. Therefore, the dark defect occurring in the second pixel group P2' may be prevented from moving to the first and third pixel groups P1' and P3'. The defect area may be prevented from extending (or expanding) from the progressive dark defect. Thus reliability of the organic light-emitting display device 3 may be improved.

According to the present example embodiment, a plurality of R pixels, a plurality of G pixels, or a plurality of B pixels constitute one pixel group P1', P2', . . . , or P12', and the second sealing layer 200f is formed at the edges of each of the pixel groups P1', P2', . . . , and P12'. However, the embodiments of the present invention are not limited thereto, each of the pixel groups P1', P2', . . . , and P12' may be formed of one or more types of different pixels R, G, and B selected out of the plurality of R pixels, the plurality of G pixels, and the plurality of B pixels. Arrangements and shapes of the pixel groups P1', P2', . . . , and P12' may also be changed.

While the various aspects of the embodiments of the present invention have been shown and described with reference to the example embodiments thereof, it will be understood by those having ordinary skill in the art that various changes in form and details may be made therein without departing from the spirit and scope of the embodiments of the present invention as defined by the following claims and their equivalents.

What is claimed is:

1. An organic light-emitting display device comprising:
a substrate having a display area and a peripheral area outside of the display area;
a display unit on the display area of the substrate, the display unit comprising a plurality of driving thin film transistors (TFTs) and a plurality of organic light-emitting diodes (OLEDs), wherein each of the plurality of OLEDs comprises:
a first electrode;
a second electrode; and
an intermediate layer between the first electrode and the second electrode, wherein the intermediate layer comprises an emission layer; and
a sealing layer covering the display unit, the sealing layer comprising a first inorganic layer, a second inorganic layer, and a plurality of organic layers interposed between the first inorganic layer and the second inorganic layer over the display area,
wherein the plurality of organic layers are spaced apart from each other,
wherein the first inorganic layer and the second inorganic layer directly contact each other at spaced areas between the plurality of organic layers in the display area; and
wherein each of the OLEDs has an associated individual intermediate layer located between the first and second electrodes.

2. The organic light-emitting display device of claim 1, wherein the first inorganic layer or the second inorganic layer is formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide.

3. The organic light-emitting display device of claim 1, wherein the plurality of organic layers are formed of an acryl resin, a methacryl resin, an isoprene resin, a vinyl resin, an epoxy resin, an urethane resin, a cellulose resin, a perylene resin, an imide resin, or a compound of two or more thereof.

4. The organic light-emitting display device of claim 1, wherein the first inorganic layer and the second inorganic layer extend along the substrate to cover at least a portion of the peripheral area around the display unit.

5. The organic light-emitting display device of claim 1,
wherein the first inorganic layer, the second inorganic layer, and respective ones of the plurality of organic layers are on respective ones of the plurality of OLEDs, and
wherein the first inorganic layer and the second inorganic layer directly contact each other at the spaced areas to enclose the plurality of OLEDs.

6. The organic light-emitting display device of claim 1, wherein the substrate is a flexible substrate.

7. The organic light-emitting display device of claim 1, wherein each of the plurality of driving TFTs comprises:
an active layer on the substrate;
a gate insulating layer on the active layer;
a gate electrode on the gate insulating layer to insulate the gate electrode from the active layer;
an interlayer dielectric layer on the gate electrode;
source and drain electrodes coupled with the active layer through openings in the interlayer dielectric layer and the gate insulating layer; and
a planarization layer on the substrate to cover the source and drain electrodes.

8. The organic light-emitting display device of claim 1,
wherein the first inorganic layer and the second inorganic layer cover the display unit, and
wherein respective ones of the plurality of organic layers are only on respective ones of the plurality of OLEDs.

9. The organic light-emitting display device of claim 1, wherein the intermediate layer comprises an organic material.

10. An organic light-emitting display device comprising:
a substrate having a display area and a peripheral area outside of the display area;
a display unit on the display area of the substrate, the display unit comprising:
a plurality of driving thin film transistors (TFTs); and
a plurality of pixel groups, each pixel group of the plurality of pixel groups comprising a plurality of pixels;
a plurality of organic light emitting diodes (OLEDs), wherein each of the plurality of OLEDs comprises:
a first electrode;
a second electrode; and
an intermediate layer between the first electrode and the second electrode, wherein the intermediate layer comprises an emission layer; and
a sealing layer covering the display unit, the sealing layer comprising a first inorganic layer, a second inorganic layer, and a plurality of organic layers interposed between the first inorganic layer and the second inorganic layer over the display area, wherein the plurality of organic layers are spaced apart from each other, and wherein the first inorganic layer and the second inorganic layer directly contact each other at spaced areas between the plurality of organic layers in the display area; and wherein each of the OLEDs has an associated individual intermediate layer located between the first and second electrodes.

11. The organic light-emitting display device of claim 10, wherein the first inorganic layer, the second inorganic layer, and respective ones of the plurality of organic layers are on respective ones of the plurality of OLEDs, and wherein the first inorganic layer and the second inorganic layer directly contact each other at the spaced areas to enclose the plurality of OLEDs.

12. The organic light-emitting display device of claim 10, wherein the first inorganic layer and the second inorganic layer extend along the substrate to cover at least a portion of the peripheral area around the display unit.

13. The organic light-emitting display device of claim 10, wherein each of the plurality of pixels is a red (R) pixel, a green (G) pixel, or a blue (B) pixel.

14. The organic light-emitting display device of claim 10, wherein the first inorganic layer and the second inorganic layer are at the spaced areas between the plurality of pixel groups.

15. The organic light-emitting display device of claim 10, wherein each of the plurality of driving TFTs comprises:
an active layer on the substrate;
a gate insulating layer on the active layer;
a gate electrode on the gate insulating layer to insulate the gate electrode from the active layer;
an interlayer dielectric layer on the gate electrode;
source and drain electrodes coupled with the active layer through openings in the interlayer dielectric layer and the gate insulating layer; and
a planarization layer on the substrate to cover the source and drain electrodes.

16. The organic light-emitting display device of claim 10, wherein each of the plurality of pixel groups comprise a same number of pixels or a different number of pixels.

17. The organic light-emitting display device of claim 10, wherein respective ones of the plurality of organic layers cover respective ones of the plurality of OLEDs, and wherein the first inorganic layer and the second inorganic layer are on the plurality of pixel groups.

18. The organic light-emitting display device of claim 10, wherein the first inorganic layer or the second inorganic layer is formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide.

19. The organic light-emitting display device of claim 10, wherein the plurality of organic layers are formed of an acryl resin, a methacryl resin, an isoprene resin, a vinyl resin, an epoxy resin, an urethane resin, a cellulose resin, a perylene resin, an imide resin, or a compound of two or more thereof.

20. The organic light-emitting display device of claim 10, wherein the display unit is a top emission display unit or a bottom emission display unit.

* * * * *